(12) United States Patent
Lui et al.

(10) Patent No.: US 7,683,689 B1
(45) Date of Patent: Mar. 23, 2010

(54) DELAY CIRCUIT WITH DELAY CELLS IN DIFFERENT ORIENTATIONS

(75) Inventors: Tat Mun Lui, Petaling Jaya (MY); Kar Keng Chua, Juru (MY); Boon Jin Ang, Bagan Ajam Butterworth (MY); Thow Pang Chong, Sungai Ara (MY); Kam Fai Suit, Kuala Lampur (MY)

(73) Assignee: Altera Corporation, San Jose, CA (US)

( * ) Notice: Subject to any disclaimer, the term of this patent is extended or adjusted under 35 U.S.C. 154(b) by 65 days.

(21) Appl. No.: 12/082,296

(22) Filed: Apr. 10, 2008

(51) Int. Cl.
*H03H 11/26* (2006.01)
(52) U.S. Cl. ........................ 327/261; 327/565
(58) Field of Classification Search .......... 327/261, 327/269, 271, 284, 564, 565, 566
See application file for complete search history.

(56) References Cited

U.S. PATENT DOCUMENTS 6,826,741 B1 * 11/2004 Johnson et al. ............... 716/12
7,463,062 B2 * 12/2008 Or-Bach et al. .............. 326/41

\* cited by examiner

*Primary Examiner*—Jeffrey S Zweizig
(74) *Attorney, Agent, or Firm*—Mauriel Kapouytian & Treffert LLP; Ararat Kapouytian

(57) ABSTRACT

A delay circuit that includes a first delay cell oriented in a first orientation and a second delay cell oriented in a second orientation is described. In one embodiment, the first orientation is perpendicular to the second orientation. More specifically, in one embodiment, the first orientation is vertical and the second orientation is horizontal.

21 Claims, 6 Drawing Sheets

DELAY CIRCUIT WITH DELAY CELLS IN DIFFERENT ORIENTATIONS

BACKGROUND

The present invention relates to delay circuits.

It is sometimes desirable to delay a signal, such as a clock signal by a predefined period of time. For example, in the double data rate (DDR) interface, the data signal (DQ signal) and the data strobe signal (DQS signal) (which may also herein be referred to as a clock signal) are sent edge aligned during a read operation. In such a context, it is desirable to phase shift the DQS signal by 90 degrees to sample the DQ signal at the center of the data valid window. To achieve the desired phase shift, a delay locked loop (DLL) is used to derive the optimum delay settings. Furthermore, it is sometimes desirable to achieve a fixed phase shift that is compensated across process, voltage and temperature (PVT) and other variations, particularly for circuits that are sensitive to PVT and other variations. Typically, the DLL includes current-starved delay cells that are tuned dynamically to an optimum delay setting to achieve the required phase shift on the DQS signal across PVT and other circuit variations.

In some cases, the delay circuit of the DLL is replicated in the input/output (I/O) banks of an integrated circuit (IC). More specifically, in some cases, the layout of the delay circuit is replicated in the layout of the vertical I/O (VIO) bank. Thereafter, the VIO bank layout is rotated to a horizontal orientation to create the layout for the horizontal I/O (HIO) bank. As a result, the layout of the delay circuit in the VIO bank has the same orientation as the layout of the delay circuit in the DLL, whereas the layout of the delay circuit in the HIO bank has a different orientation than the layout of the delay circuits in the DLL and the VIO bank.

FIG. 1 illustrates an IC with VIO and HIO banks. In FIG. 1, IC 100 includes core 101, DLL 110, VIO bank 150 and HIO bank 190. DLL 110 includes delay circuit 118, which includes current-starved delay cells orientated in the vertical direction. Delay cells include inverters or buffers for delaying signals. The inverters or buffers in turn include transistors. As used herein, the orientation of a delay cell refers to the orientation of the devices making up the delay cell, i.e., the inverters or buffers (or more specifically, the transistors making up the inverters or buffers) of the delay cell. VIO bank 150 includes VIO pin groups 120, 130, and 140 (which may also be referred to as VIO DQS data groups 120, 130, and 140). HIO bank 190 includes HIO pin groups 160, 170, and 180 (which may also be referred to as HIO DQS data groups 160, 170, and 180).

VIO pin group 120 includes pin circuits 121-125. VIO pin circuits 121, 122, 124, and 125 represent data pin circuits (e.g., DQ pin circuits), whereas VIO pin circuit 123 represents a clock pin circuit (e.g., a DQS pin circuit). VIO pin circuit 123 includes I/O pin (or pad) 126, buffer 127, delay circuit 128, and capture register 129. Delay circuit 128 has the same layout as delay circuit 118 of DLL 110. Moreover, the layout of delay circuit 128 is orientated in the same direction as the layout of delay circuit 118. As a result, delay cells in delay circuit 128 have the same orientation as delay cells in delay circuit 118. Additionally, DLL 110 drives the delay settings out to delay circuit 128. As a result, delay circuit 128 produces the required delay that was determined by DLL 110. The delayed clock signal from delay circuit 128 is also fed into the capture registers of VIO pin circuits 121, 122, 124, and 125.

As can be seen in FIG. 1, VIO pin groups 130 and 140 are similar to VIO pin group 120. As VIO pin groups 130 and 140 are similar to VIO pin group 120, they are not described in detail. It is to be noted that DLL 110 drives the delay setting of the delay circuits in VIO pin groups 130 and 140.

DLL 110 also drives the delay setting of the delay circuit in HIO pin groups 160, 170, and 180. The delay circuit in HIO pin group 160 has been referenced as delay circuit 168 in FIG. 1, whereas those of HIO pin groups 170 and 180 have not been referenced with a reference number. The layout of delay circuit 168 is orientated in a horizontal orientation. Similarly, the layouts of delay circuits in HIO pin groups 170 and 180 are also orientated in a horizontal orientation. Moreover, delay cells in delay circuit 168 are orientated in a horizontal orientation. Similarly, delay cells in delay circuits of pin groups 170 and 180 are also oriented in a horizontal, rather than a vertical, orientation.

FIGS. 2A, 2B, and 2C are block diagrams of the DLL, VIO, and HIO delay circuits, respectively, of FIG. 1. Moreover, FIGS. 2A-2C illustrate the relative orientation of the delay cells in the DLL, VIO, and HIO delay circuits of FIG. 1. In FIG. 2A, DLL delay circuit 118 includes delay cells 211, 212, 213, 214, 221, 222, 223, and 224 and multiplexer 230. Delay cells 211-214 are connected in series and delay the input clock signal CLKIN. The output of delay cell 214 is provided to multiplexer 230 and delay cell 221. Delay cells 221-224 are also connected in series and delay the delayed clock signal provided to them by delay cell 214. The output of delay cell 224 is provided to multiplexer 230. When IC 100 operates in high frequency mode, multiplexer 230 selects the delayed signal received from delay cell 214. Multiplexer 230 outputs the output clock signal CLKOUT for DLL delay circuit 118. On the other hand, when IC 100 operates in low frequency mode, multiplexer 230 selects the delayed signal received from delay cell 224. Delay cells 211-214 and 221-224 are oriented in a vertical direction as noted by the arrows therein in FIG. 2A.

As shown in FIG. 2B, VIO delay circuit 128 includes delay cells 241, 242, 243, 244, 251, 252, 253, and 254 and multiplexer 260. As can also be seen in FIGS. 2A and 2B, VIO delay circuit 128 is identical to DLL delay circuit 118. Therefore, VIO delay circuit 128 will not be described in further detail herein. It is to be noted that in VIO delay circuit 128, delay cells 241-244 and 251-254 are oriented in a vertical direction as noted by the arrows illustrated therein in FIG. 2B.

As shown in FIG. 2C, HIO delay circuit 168 includes delay cells 271, 272, 273, 274, 281, 282, 283, and 284 and multiplexer 290. In HIO delay circuit 168, delay cells 271-274 and 281-284 are oriented in a horizontal direction as noted by the arrows therein illustrated in FIG. 2C. Delay cells 271-274 are connected in series. Similarly, delay cells 281-284 are connected in series. The output of delay cell 274 is provided to multiplexer 290 and delay cell 281. The output of delay cell 284 is also provided to multiplexer 290. Multiplexer 290 outputs the output clock signal CLKOUT for HIO delay circuit 168. When IC 100 operates in high frequency mode, multiplexer 290 selects the delayed signal received from delay cell 274. On the other hand, when IC 100 operates in low frequency mode, multiplexer 290 selects the delayed signal received from delay cell 284.

As noted above, the delay cells in the delay circuits of the DLL 110 and VIO bank 150 have the same orientation, both being orientated in the vertical direction. On the other hand, as the delay cells in the delay circuits of the HIO bank 190 are orientated in the horizontal direction, they have a different orientation than those of DLL 110 and VIO bank 150. Delay cells in the layout with different orientation may be susceptible to channel length variation during the fabrication process, particularly if the process uses sub-micron technologies.

This results in performance differences between delay cells with different orientations. This performance difference may herein be referred to as a poly-orientation effect. Thus, for example, delay cells in the DLL and the VIO bank may have a different performance from delay cells in the HIO bank. As a result, the optimum delay setting derived by the DLL will be optimum for the VIO bank as the delay cells in the DLL and VIO bank are drawn in the layout in a similar orientation. However, the delay settings determined in the DLL will not be optimum for the delay cells in the HIO bank which have a different orientation than those of the DLL. This results in different phase shifts for the DQS signals in the VIO and HIO banks. This may cause timing violations, particularly at high operating frequencies.

SUMMARY

In one aspect, an embodiment of the present invention provides a delay circuit that includes a first delay cell oriented in a first orientation and a second delay cell oriented in a second orientation. In one embodiment, the first orientation is perpendicular to the second orientation. More specifically, in one embodiment, the first orientation is vertical and the second orientation is horizontal.

In one embodiment, each of the VIO bank and the HIO bank include a delay circuit that includes a first delay cell orientated in the vertical orientation and a second delay cell orientated in the horizontal orientation. As a result, these delay circuits in the VIO and HIO banks produce delayed clock signals that are similar in terms of their phase shifts than delayed clock signals produced by delay circuits in VIO and HIO banks whose delay cells are orientated in different directions.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 3A:
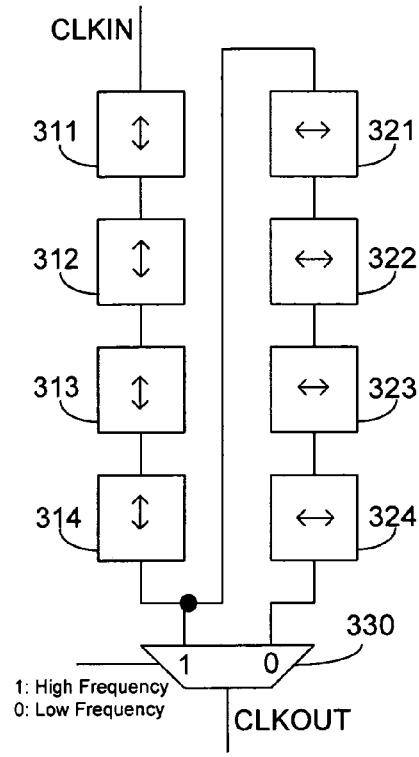
FIGS. 3A, 3B, and 3C are block diagrams of the DLL, VIO, and HIO delay circuits, respectively, of one embodiment of the present invention.
Figure 3B:
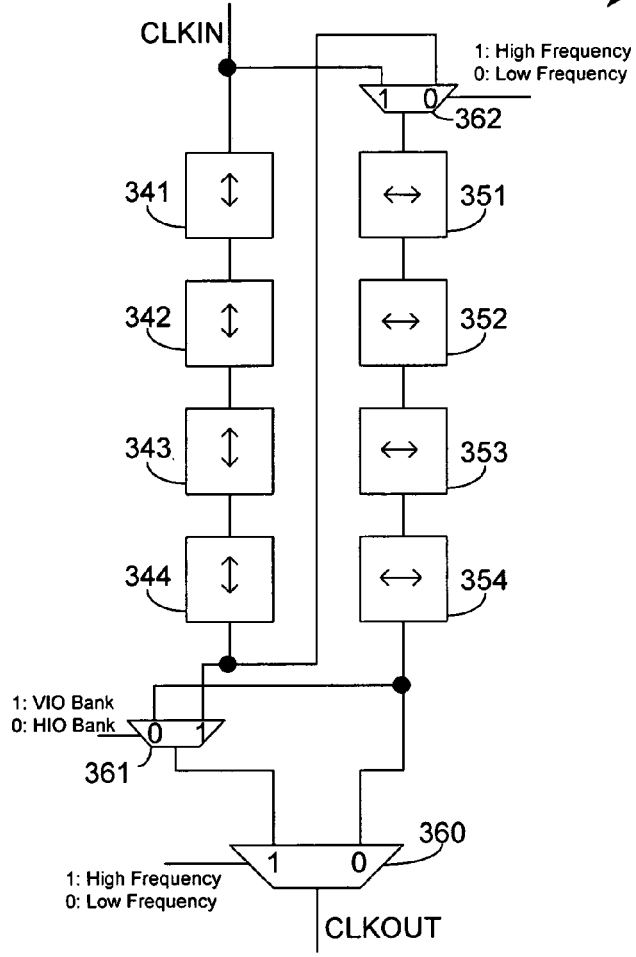
Figure 3C:
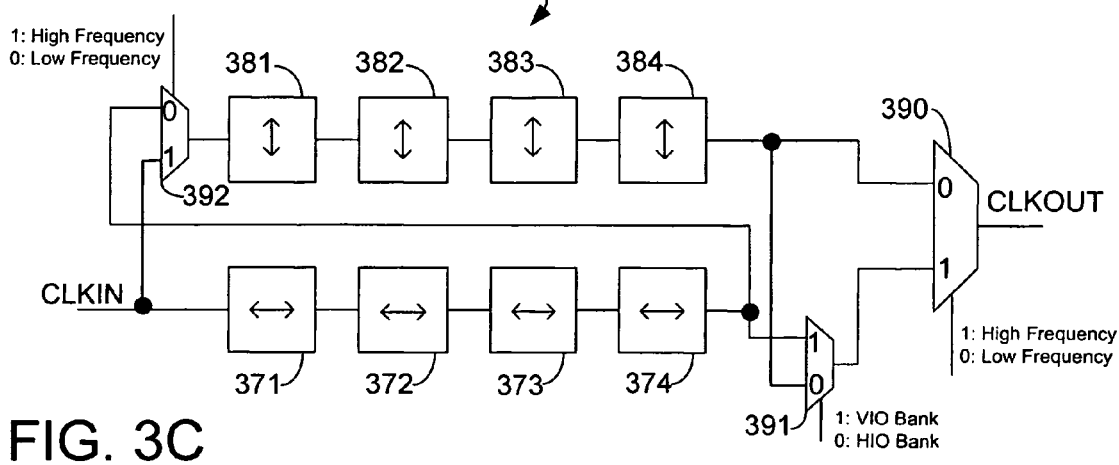

FIGS. 3A, 3B, and 3C are block diagrams of the DLL, VIO, and HIO delay circuits, respectively, of one embodiment of the present invention. FIGS. 3A-3C illustrate the relative orientation of the delay cells in the DLL, VIO, and HIO delay circuits of one embodiment of the present invention. In FIG. 3A, DLL delay circuit 310 includes delay cells 311, 312, 313, 314, 321, 322, 323, and 324 and multiplexer 330. Delay cells 311-314 all of which are orientated in the vertical direction are connected in series and delay the input clock signal CLKIN. The output of delay cell 314 is provided to multiplexer 330 and delay cell 321. Delay cells 321-324 all of which are orientated in the horizontal direction are also connected in series and further delay the delayed clock signal provided to them by delay cell 314. The output of delay cell 324 is provided to multiplexer 330. Multiplexer 330 outputs the output clock signal CLKOUT for DLL delay circuit 310. In high frequency mode, multiplexer 330 selects the delayed signal received from delay cell 314. On the other hand, in low frequency mode, multiplexer 330 selects the delayed signal received from delay cell 324.

VIO delay circuit 340 includes delay cells 341, 342, 343, 344, 351, 352, 353, and 354 and multiplexers 360, 361, and 362, which are coupled as shown in FIG. 3B. Delay cells 341-344 all of which are orientated in the vertical direction are connected in series and delay the input clock signal CLKIN. Delay cells 351-354 all of which are orientated in the horizontal direction are also connected in series and further delay the delayed clock signal provided to them. As can be seen in FIGS. 3A and 3B, delay cells 341-344 are orientated in the same direction as delay cells 311-314, whereas delay cells 351-354 are orientated in the same direction as delay cells 321-324. Similarly, with exceptions noted below, the vertically and horizontally orientated delay cells in DLL circuit 310 and VIO delay circuit 340 are coupled to multiplexers 330 and 360, respectively, in a similar manner. Therefore, the layout, with the below noted exceptions, for DLL circuit 310 can be used for VIO delay circuit 340.

In VIO delay circuit 340, the output of delay cell 344 is provided to multiplexers 361 and 362. Moreover, the input clock signal CLKIN is provided to multiplexer 362. Multiplexer 361 also receives the output of delay cell 354. As multiplexer 361 is in a VIO bank, it selects the input it receives from delay cell 344. Multiplexer 360 receives the output of multiplexer 361 and the output of delay cell 354. Multiplexer 360 outputs the output clock signal CLKOUT for VIO delay circuit 340.

In high frequency mode, multiplexer 362 selects CLKIN to provide to delay cell 351. On the other hand, in low frequency mode, multiplexer 362 selects the output of delay cell 344 to provide to delay cell 351. Similarly, in high frequency mode, multiplexer 360 selects the input received from multiplexer 361. On the other hand, in low frequency mode, multiplexer 360 selects the input received from delay cell 354.

FIG. 3C illustrates HIO delay circuit 370, which reuses the layout for VIO delay circuit 340, but is rotated by 90 degrees in a counterclockwise direction. HIO delay circuit 370 includes delay cells 371, 372, 373, 374, 381, 382, 383, and 384 and multiplexers 390, 391, and 392. Delay cells 371-374 all of which are orientated in the horizontal direction are connected in series and delay the input clock signal CLKIN. Delay cells 381-384 all of which are orientated in the vertical direction are also connected in series and further delay the delayed clock signal provided to them.

In HIO delay circuit 370, the output of delay cell 374 is provided to multiplexers 391 and 392. Moreover, the input clock signal CLKIN is provided to multiplexer 392. Multiplexer 391 also receives the output of delay cell 384. As multiplexer 391 is in a HIO bank, it selects the input it receives from delay cell 384. Multiplexer 390 receives the output of multiplexer 391 and the output of delay cell 384. Multiplexer 390 outputs the output clock signal CLKOUT for HIO delay circuit 370.

In high frequency mode, multiplexer 392 selects CLKIN to provide to delay cell 381. On the other hand, in low frequency mode, multiplexer 392 selects the output of delay cell 374 to provide to delay cell 381. Similarly, in high frequency mode, multiplexer 390 selects the input received from multiplexer 391. On the other hand, in low frequency mode, multiplexer 390 selects the input received from delay cell 384.

When operating in high frequency mode, DLL delay circuit 310 uses the delay cells that are in the vertical orientation (i.e., delay cells 311-314) to determine the delay settings. Similarly, when operating in high frequency mode, in VIO delay circuit 340, multiplexers 360 and 361 select the delay cells that are in the vertical orientation (i.e., delay cells 341-344), which match the orientation of delay cells of the DLL. Similarly, when operating in high frequency mode, in HIO delay circuit 370, multiplexers 390, 391, and 392 select the delay cells that are in the vertical orientation (i.e., delay cells 381-384), which match the orientation of delay cells of the DLL. Therefore, an accurate delay, as determined by the DLL, is obtained for both the VIO and HIO banks.

When operating in low frequency mode, DLL delay circuit 310 uses the delay cells in the vertical orientation (i.e., delay cells 311-314) as well as delay cells in the horizontal orientation (i.e., delay cells 321-324) to determine the delay settings. Similarly, when operating in low frequency mode, in VIO delay circuit 340, multiplexers 360, 361, and 362 select the delay cells in the vertical orientation (i.e., delay cells 341-344) as well as delay cells in the horizontal orientation (i.e., delay cells 351-354) to determine delay settings. In both DLL circuit 310 and VIO delay circuit 340, the vertical and horizontal delay cells are used in the same order. In other words, first the vertical delay cells are used and then the horizontal delay cells are used. Therefore, an accurate delay, as determined by the DLL, is obtained for the VIO bank in low frequency mode.

Figure 1:
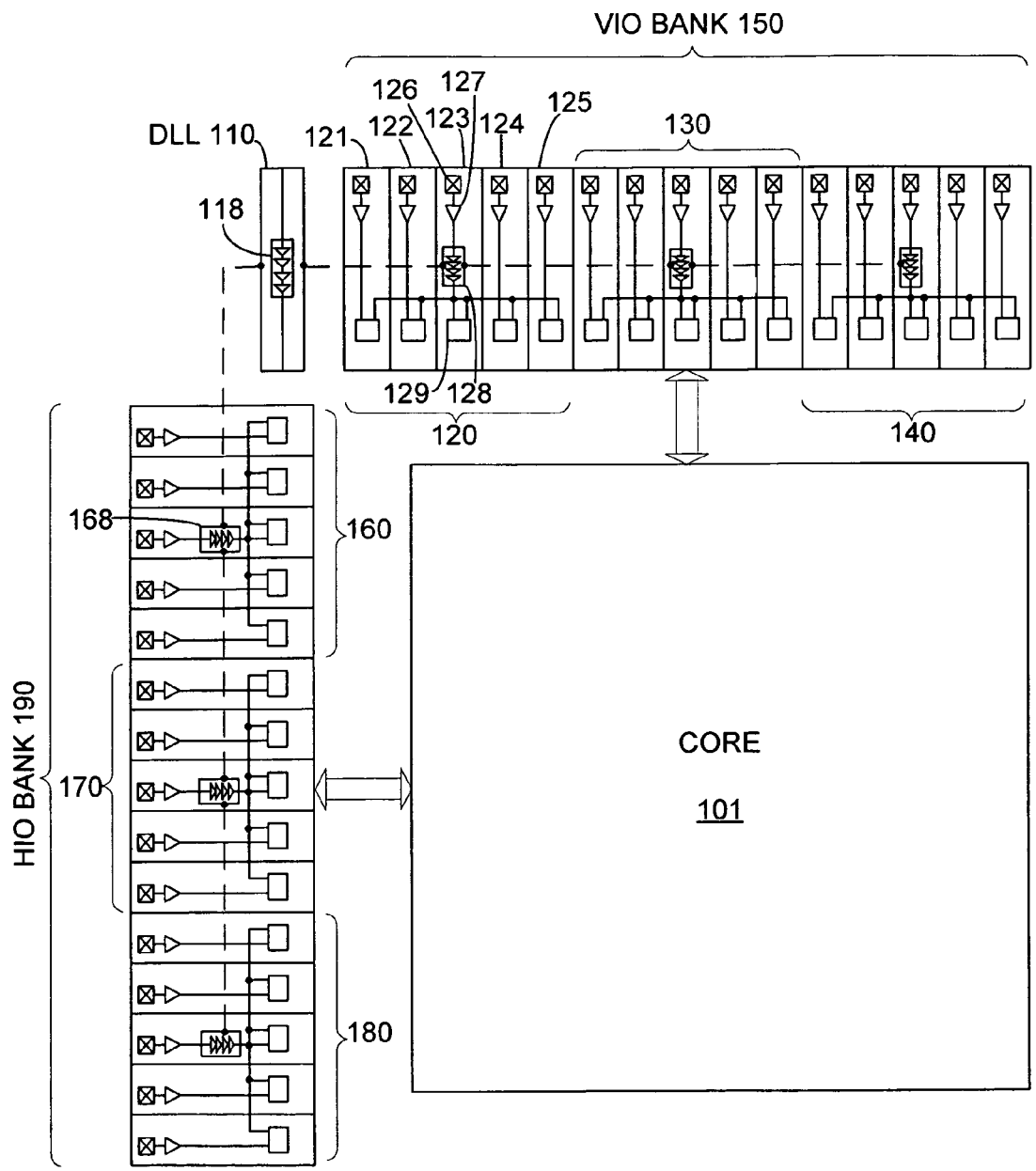
FIG. 1 illustrates an IC with VIO and HIO banks.
Figure 2A:
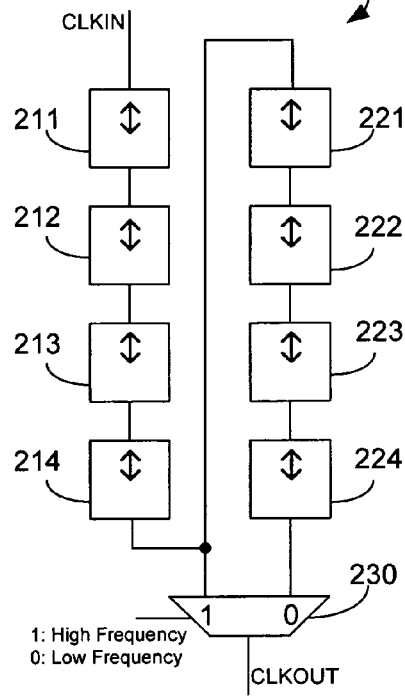
FIGS. 2A, 2B, and 2C are block diagrams of the DLL, VIO, and HIO delay circuits, respectively, of FIG. 1.
Figure 2B:
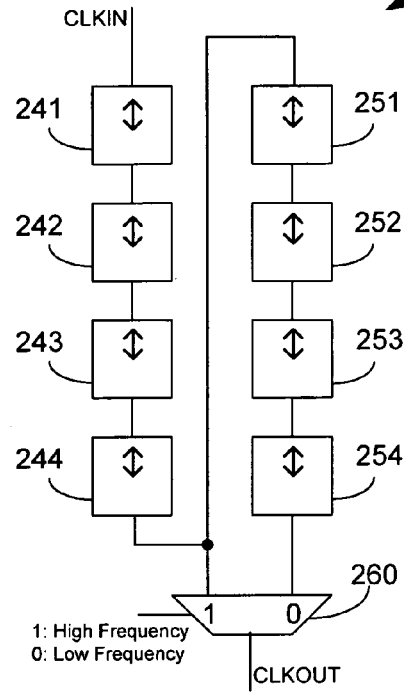
Figure 2C:
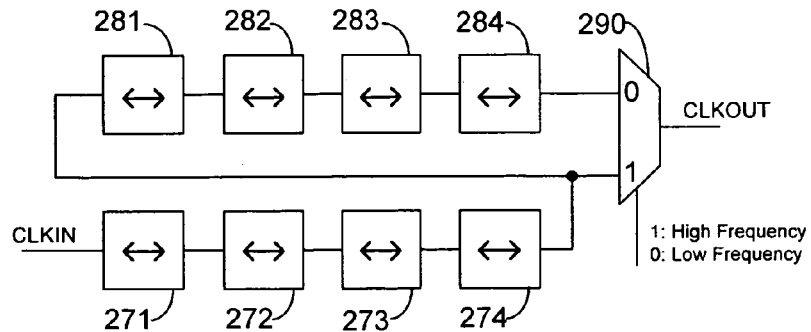

When operating in low frequency mode, in HIO delay circuit 370, multiplexers 390, 391, and 392 select the delay cells in the vertical orientation (i.e., delay cells 381-384) as well as delay cells in the horizontal orientation (i.e., delay cells 371-374) to determine delay settings. In both DLL circuit 310 and VIO delay circuit 340, first the vertical delay cells are used and then the horizontal delay cells are used. On the other hand, in HIO delay circuit 370, first the horizontal delay cells are used and then the vertical delay cells are used. Therefore, the delay in HIO delay circuit 370 in low frequency mode may be different than that determined by the DLL. This is because the slew rate for the vertical and horizontal delay cells may be different. However, the delay obtained by the HIO delay circuit 370, in low frequency mode, is nonetheless more accurate than that obtained by the HIO delay circuit 168 (shown in FIGS. 1 and 2C). This is because HIO delay circuit 370, like DLL delay circuit 310, uses both vertically and horizontally orientated delay cells and as a result differences due to poly-orientation are averaged out.

Figure 4A:
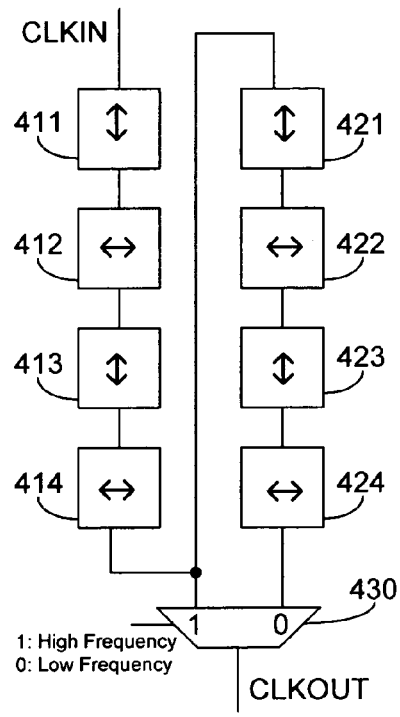
FIGS. 4A, 4B, and 4C are block diagrams of the DLL, VIO, and HIO delay circuits, respectively, of another embodiment of the present invention.
Figure 4B:
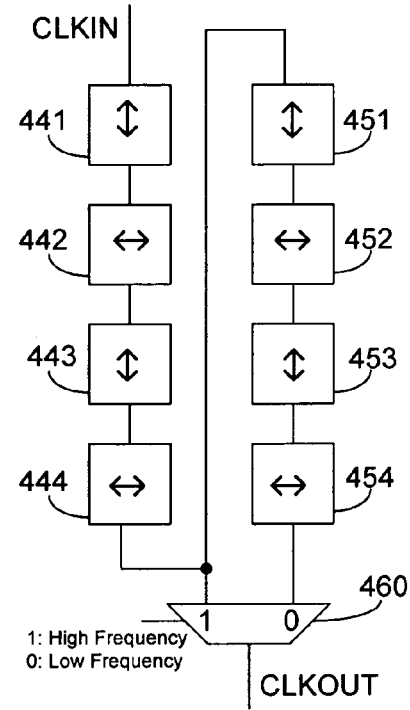
Figure 4C:
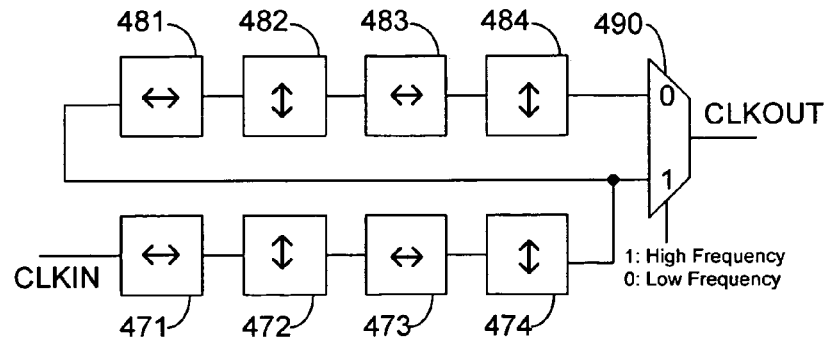

FIGS. 4A, 4B, and 4C are block diagrams of the DLL, VIO, and HIO delay circuits, respectively, of another embodiment of the present invention. FIGS. 4A-4C illustrate the relative orientation of the delay cells in the DLL, VIO, and HIO delay circuits of another embodiment of the present invention. In FIG. 4A, DLL delay circuit 410 includes delay cells 411, 412, 413, 414, 421, 422, 423, and 424 and multiplexer 430. Delay cells 411-414 are connected in series and delay the input clock signal CLKIN. One group of alternate delay cells (i.e., delay cells 411 and 413) in delay cell group 411-414 are orientated in the vertical directions, whereas another group of alternate delay cells (i.e., delay cells 412 and 414) in delay cell group 411-414 are orientated in the horizontal direction. In other words, starting from delay cell 411, every other delay cell in delay cell group 411-414 is orientated in the vertical direction. Similarly, starting from delay cell 412, every other delay cell in delay cell group 411-414 is orientated in the horizontal direction. The output of delay cell 414 is provided to multiplexer 430 and delay cell 421.

Delay cells 421-424 are also connected in series and further delay the delayed clock signal provided to them by delay cell 414. One group of alternate delay cells (i.e., delay cells 421 and 423) in delay cell group 421-424 are orientated in the vertical directions, whereas another group of alternate delay cells (i.e., delay cells 422 and 424) in delay cell group 421-424 are orientated in the horizontal direction. In other words, starting from delay cell 421, every other delay cell in delay cell group 421-424 is orientated in the vertical direction. Similarly, starting from delay cell 422, every other delay cell in delay cell group 421-424 is orientated in the horizontal direction. The output of delay cell 424 is provided to multiplexer 430. Multiplexer 430 outputs the output clock signal CLKOUT for DLL delay circuit 410. In high frequency mode, multiplexer 430 selects the delayed signal received from delay cell 414. On the other hand, in low frequency mode, multiplexer 430 selects the delayed signal received from delay cell 424.

FIG. 4B illustrates VIO delay circuit 440, which reuses the layout for DLL delay circuit 410. VIO delay circuit 440 includes delay cells 441, 442, 443, 444, 451, 452, 453, and 454 and multiplexer 460, which are coupled as shown in FIG. 4B. Delay cell groups 441-444 and 452-454 are similar to delay cell groups 411-414 and 421-424, respectively. Therefore, they will not be further described herein. Multiplexer 460 is similar to multiplexer 430 and will not be further described herein.

FIG. 4C illustrates HIO delay circuit 470, which reuses the layout for VIO delay circuit 440, but is rotated by 90 degrees in a counterclockwise direction. HIO delay circuit 470 includes delay cells 471, 472, 473, 474, 481, 482, 483, and 484 and multiplexer 490. Delay cells 471-474 are connected in series and delay the input clock signal CLKIN. One group of alternate delay cells (i.e., delay cells 471 and 473) in delay cell group 471-474 are orientated in the horizontal direction, whereas another group of alternate delay cells (i.e., delay cells 472 and 474) in delay cell group 471-474 are orientated in the vertical direction. In other words, starting from delay cell 471, every other delay cell in delay cell group 471-474 is orientated in the horizontal direction. Similarly, starting from delay cell 472, every other delay cell in delay cell group 471-474 is orientated in the vertical direction. The output of delay cell 474 is provided to multiplexer 490 and delay cell 481.

Delay cells 481-484 are also connected in series and further delay the delayed clock signal provided to them by delay cell 474. One group of alternate delay cells (i.e., delay cells 481 and 483) in delay cell group 481-484 are orientated in the horizontal direction, whereas another group of alternate delay cells (i.e., delay cells 482 and 484) in delay cell group 481-484 are orientated in the vertical direction. In other words, starting from delay cell 481, every other delay cell in delay cell group 481-484 is orientated in the horizontal direction. Similarly, starting from delay cell 482, every other delay cell in delay cell group 481-484 is orientated in the vertical direction. The output of delay cell 484 is provided to multiplexer 490. Multiplexer 490 outputs the output clock signal CLKOUT for HIO delay circuit 490. In high frequency mode, multiplexer 490 selects the delayed signal received from delay cell 474. On the other hand, in low frequency mode, multiplexer 490 selects the delayed signal received from delay cell 484.

When operating in high frequency mode, DLL delay circuit 410 uses two delay cells orientated in the vertical direction (i.e., delay cells 411 and 413) and two delay cells orientated in the horizontal direction (i.e., delay cells 412 and 414). Similarly, when operating in high frequency mode, VIO delay circuit 440 uses two delay cells orientated in the vertical direction (i.e., delay cells 441 and 443) and two delay cells orientated in the horizontal direction (i.e., delay cells 442 and 444). Moreover, both DLL delay circuit 410 and VIO delay circuit 440 use the vertically and horizontally orientated delay cells in the same order. Therefore, for high frequency operation, an accurate delay, as determined by the DLL, is obtained for the VIO bank. In high frequency mode, HIO delay circuit 470 also uses two delay cells orientated in the vertical direction (i.e., delay cells 472 and 474) and two delay cells orientated in the horizontal direction (i.e., delay cells 471 and 473). However, in HIO delay circuit 470 the order of use of the horizontally and vertically orientated delay cells is the not same as that in DLL delay circuit 410. Therefore, in high frequency mode, the delay in HIO delay circuit 470 does not exactly match the delay determined by the DLL circuit. However, the delay obtained by the HIO delay circuit 470, in high frequency mode, is nonetheless more accurate than that obtained by HIO delay circuit 168 (shown in FIGS. 1 and 2C). This is because HIO delay circuit 470, like DLL delay circuit 410, uses both vertically and horizontally orientated delay cells and as a result differences due to poly-orientation are averaged out.

When operating in low frequency mode, DLL delay circuit 410 uses four delay cells orientated in the vertical direction (i.e., delay cells 411, 413, 421, and 423) and four delay cells orientated in the horizontal direction (i.e., delay cells 412, 414, 422, and 424). Similarly, when operating in high frequency mode, VIO delay circuit 440 uses four delay cells orientated in the vertical direction (i.e., delay cells 441, 443, 451, and 453) and four delay cells orientated in the horizontal direction (i.e., delay cells 442, 444, 452, and 454). Moreover, both DLL delay circuit 410 and VIO delay circuit 440 use the vertically and horizontally orientated delay cells in the same order. Therefore, for low frequency operation, an accurate delay, as determined by the DLL, is obtained for the VIO bank. In low frequency mode, HIO delay circuit 470 also uses four delay cells orientated in the vertical direction (i.e., delay cells 472, 474, 482, and 484) and four delay cells orientated in the horizontal direction (i.e., delay cells 471, 473, 481, and 483). However, in HIO delay circuit 470 the order of use of the horizontally and vertically orientated delay cells is the not the same as that in DLL delay circuit 410. Therefore, in low frequency mode, the delay in HIO delay circuit 470 does not exactly match the delay determined by the DLL circuit. However, the delay obtained by the HIO delay circuit 470, in low frequency mode, is nonetheless more accurate than that obtained by HIO delay circuit 168 (shown in FIGS. 1 and 2C). This is because HIO delay circuit 470, like DLL delay circuit 410, uses both vertically and horizontally orientated delay cells and as a result differences due to poly-orientation are averaged out.

Figure 5A:
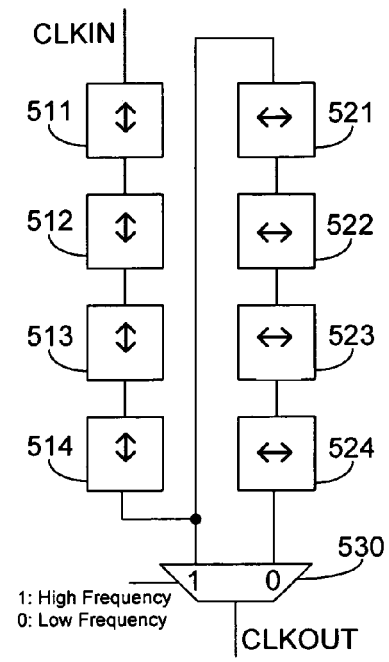
FIGS. 5A, 5B, and 5C are block diagrams of the DLL, VIO, and HIO delay circuits, respectively, of yet another embodiment of the present invention.
Figure 5B:
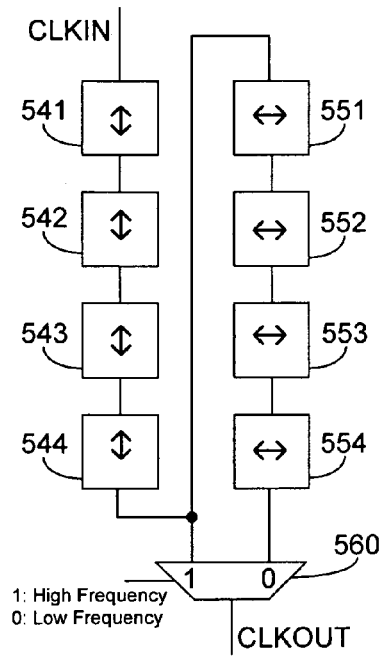
Figure 5C:
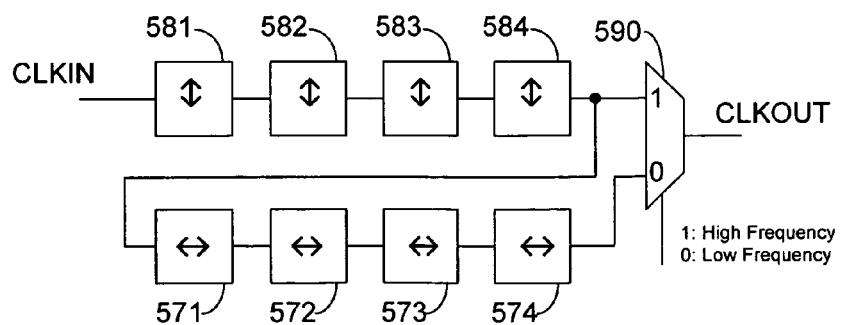

FIGS. 5A, 5B, and 5C are block diagrams of the DLL, VIO, and HIO delay circuits, respectively, of yet another embodiment of the present invention. FIGS. 5A-5C illustrate the relative orientation of the delay cells in the DLL, VIO, and HIO delay circuits of another embodiment of the present invention. In FIG. 5A, DLL delay circuit 510 includes delay cells 511, 512, 513, 514, 521, 522, 523, and 524 and multiplexer 530. Delay cells 511-514 all of which are orientated in the vertical direction are connected in series and delay the input clock signal CLKIN. The output of delay cell 514 is provided to multiplexer 530 and delay cell 521. Delay cells 521-524 all of which are orientated in the horizontal direction are also connected in series and further delay the delayed clock signal provided to them by delay cell 514. The output of delay cell 524 is provided to multiplexer 530. Multiplexer 530 outputs the output clock signal CLKOUT for DLL delay circuit 510. In high frequency mode, multiplexer 530 selects the delayed signal received from delay cell 514. On the other hand, in low frequency mode, multiplexer 530 selects the delayed signal received from delay cell 524.

FIG. 5B illustrates VIO delay circuit 540, which reuses the layout for DLL delay circuit 510. VIO delay circuit 540 includes delay cells 541, 542, 543, 544, 551, 552, 553, and 554 and multiplexer 560, which are coupled as shown in FIG. 5B. Delay cell groups 541-544 and 552-554 are similar to delay cell groups 511-514 and 521-524, respectively. Therefore, they will not be further described herein. Multiplexer 560 is similar to multiplexer 530 and will not be further described herein. In high frequency mode, multiplexer 560 selects the delayed signal received from delay cell 544. On the other hand, in low frequency mode, multiplexer 560 selects the delayed signal received from delay cell 554.

FIG. 5C illustrates HIO delay circuit 570, which reuses the same delay cells as VIO delay circuit 540, but rotated by 90 degrees in a counterclockwise direction and connected differently as explained below. HIO delay circuit 570 includes delay cells 571, 572, 573, 574, 581, 582, 583, and 584 and multiplexer 590. Delay cells 581-584 all of which are orientated in the vertical direction are connected in series and delay the input clock signal CLKIN. The output of delay cell 584 is provided to multiplexer 590 and delay cell 571. Delay cells 571-574 all of which are orientated in the horizontal direction are also connected in series and further delay the delayed clock signal provided to them by delay cell 584. The output of delay cell 574 is provided to multiplexer 590. Multiplexer 590 outputs the output clock signal CLKOUT for HIO delay circuit 570. In high frequency mode, multiplexer 590 selects the delayed signal received from delay cell 584. On the other hand, in low frequency mode, multiplexer 590 selects the delayed signal received from delay cell 574.

In HIO delay circuit 570, the input clock signal CLKIN is tied to the first row of delay cells (i.e., delay cells 581-584). On the other hand, in VIO delay circuit 540, CLKIN is tied to the second row of delay cells (i.e., delay cells 541-544). Similarly, in DLL delay circuit 510, CLKIN is tied to the second row of delay cells (i.e., delay cells 511-514).

Also, in HIO delay circuit 570, the connection for low frequency mode is from the last delay cell on the first row of delay cells (i.e., delay cell 584) to the first delay cell on the second row of delay cells (i.e., delay cell 571). On the other hand, in VIO delay circuit 540, the connection for low frequency mode is from the last delay cell on the second row of delay cells (i.e., delay cell 544) to the first delay cell on the first row of delay cells (i.e., delay cell 551). Similarly, in DLL delay circuit 510, the connection for low frequency mode is from the last delay cell on the second row of delay cells (i.e., delay cell 514) to the first delay cell on the first row of delay cells (i.e., delay cell 521).

Finally, in HIO delay circuit 570, inputs to multiplexer 590 are flipped relative to the inputs to multiplexers 530 and 560. Thus, input 0 of multiplexer 590 is connected to the last delay cell of the second row of delay cells (i.e., delay cell 574) and input 1 of multiplexer 590 is connected to the last delay cell of the first row of delay cells (i.e., delay cell 584). On the other hand, input 0 of multiplexer 560 is connected to the last delay cell of the first row of delay cells (i.e., delay cell 554) and input 1 of multiplexer 560 is connected to the last delay cell of the second row of delay cells (i.e., delay cell 544). Similarly, input 0 of multiplexer 530 is connected to the last delay cell of the first row of delay cells (i.e., delay cell 524) and input 1 of multiplexer 530 is connected to the last delay cell of the second row of delay cells (i.e., delay cell 514).

For VIO delay circuit 540, the delay obtained is accurate, as determined by the DLL, for both high and low frequency modes, as the identical layout is used for both VIO delay circuit 540 and DLL delay circuit 510. Similarly, for HIO delay circuit 540, the delay obtained is accurate, as determined by the DLL, for both high and low frequency modes, as both delay circuits use the same number of delay cells in the same orientation and in the same order.

It is to be noted that in all of the embodiments of the present invention described above the entire VIO bank and not only the delay circuit therein is rotated to obtain the layout for the corresponding delay circuit in the HIO bank. As a result, the embodiments of the present invention do not suffer from routing blockage issues. Routing blockage issues would arise, for example, as a result of specially rotating the delay circuits (i.e., rotating only the delay circuits) in the HIO bank 190 (shown in FIG. 1) such that their delay cells are in the same orientation as the delay cells of delay circuits in the DLL and VIO banks 110 and 150 (also shown in FIG. 1). Such rotation would create routing blockage in HIO bank 190 as the delay circuit metal layers will be in a different orientation than the neighboring devices in the HIO bank to which the delay circuit is connected. Overcoming this routing blockage would require a massive effort to re-layout the HIO bank by jogging the metal tracks or jumping to a different metal layer. This would cause performance mismatches and inefficient use of die area.

In one embodiment, the delay cells in the delay circuits of the present invention are current starved delay cells and are fabricated using sub-micron fabrication processes. Also, in one embodiment, the delay circuits are sensitive to variation. It is to be noted, however, that the present invention is not limited to such delay cells and delay circuits. It is also to be noted that the present invention is not limited to the number of delay cells shown in the drawings, which are only exemplary. Instead, delay circuits of the present invention can include any number of delay cells. It is also to be noted that, in one embodiment, the delay of the delay cells is tunable. In other words, the delay of the delay cells may be varied. This may be done, for example, by varying the current through the delay cells or by other techniques. Also, in one embodiment, matching delays may be added to DLL delay circuit 310 (shown in FIG. 3A) to account for delays of multiplexers in VIO delay circuit 340 (shown in FIG. 3B) or HIO delay circuit 370 (shown in FIG. 3C) that have no counterparts in DLL delay circuit 310, i.e., multiplexers 361, 362, 391, and 392. The matching of delays may also be achieved by using a loading in DLL delay circuit 310 that is different from the loading used in VIO delay circuit 340 and HIO delay circuit 370.

Circuits including a delay circuit embodying the present invention might be included in a variety of ICs, including ICs that are programmable logic devices (PLDs). PLDs (also sometimes referred to as complex PLDs (CPLDs), programmable array logic (PALs), programmable logic arrays (PLAs), field PLAs (FPLAs), erasable PLDs (EPLDs), electrically erasable PLDs (EEPLDs), logic cell arrays (LCAs), field programmable gate arrays (FPGAs), or by other names) provide the advantages of fixed ICs with the flexibility of custom ICs. Such devices typically provide an "off the shelf" device having at least a portion that can be programmed to meet a user's specific needs. Application specific integrated circuits (ASICs) have traditionally been fixed ICs. However, it is possible to provide an ASIC that has a portion or portions that are programmable. Thus, it is possible for an IC device to have qualities of both an ASIC and a PLD. The term PLD as used herein will be considered broad enough to include such devices.

PLDs have configuration elements that may be programmed or reprogrammed. Configuration elements may be realized as random access memory (RAM) bits, flip-flops, electronically erasable programmable read-only memory (EEPROM) cells, or other memory elements. Placing new data into the configuration elements programs or reprograms the PLD's logic functions and associated routing pathways. Configuration elements that are field programmable are often implemented as RAM cells (sometimes referred to a "configuration RAM" (CRAM)). However, many types of configurable elements may be used including static or dynamic RAM (SRAM or DRAM), electrically erasable read-only memory (EEROM), flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "configuration element" will be used to refer to any programmable element that may be configured to determine functions implemented by other PLD elements.

Figure 6:
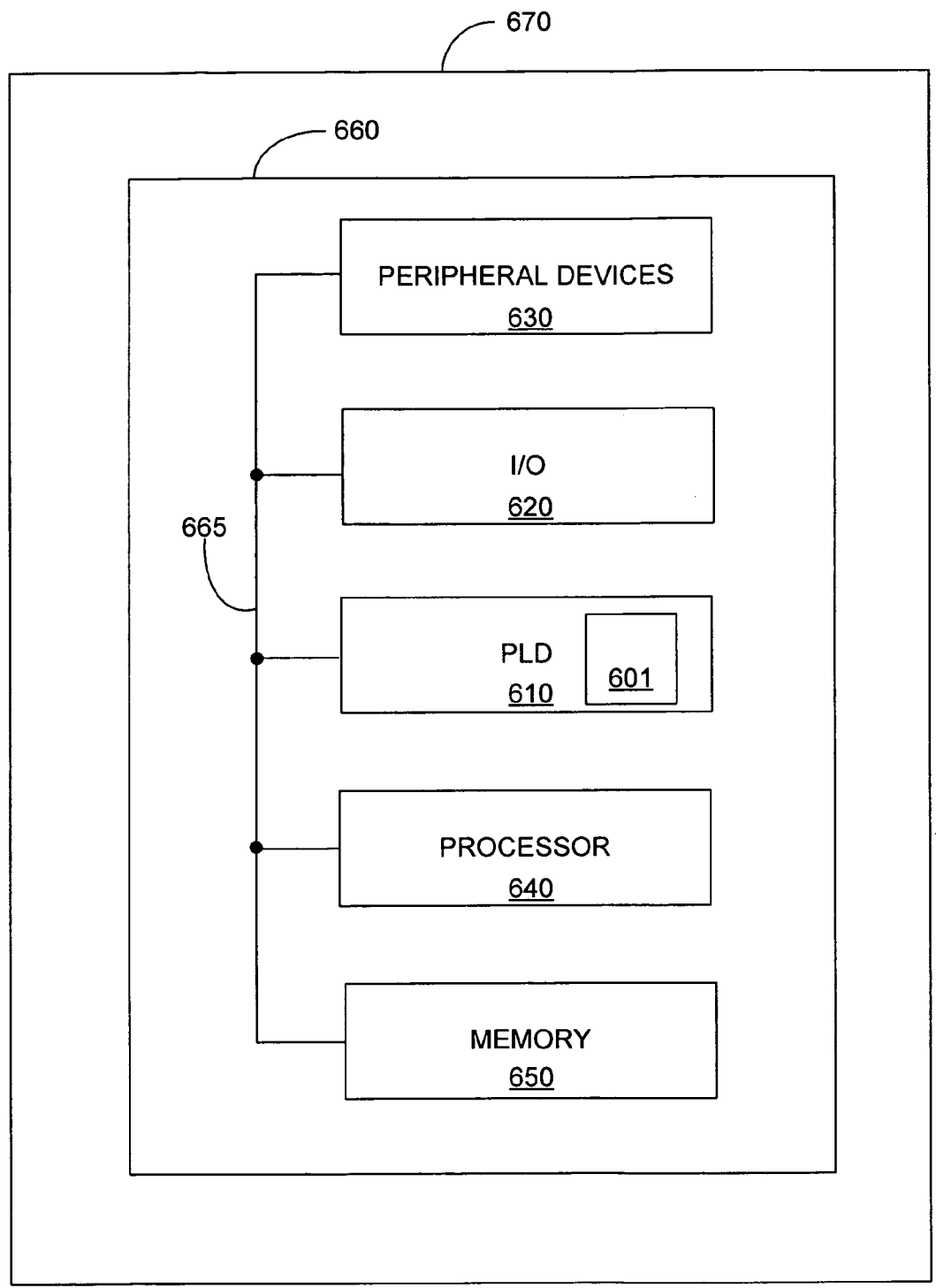
FIG. 6 illustrates an exemplary data processing system including an exemplary programmable logic device in which circuits in accordance with the present invention might be implemented.

FIG. 6 illustrates, by way of example, PLD 610 in data processing system 600. As one example, circuits of this invention may be implemented in PLDs such as PLD 610. In one embodiment, delay circuit 601 (such as delay circuits shown in FIGS. 3A-3C, 4A-4C or 5A-5C) is on the same die/chip as PLD 610. Data processing system 600 may include one or more of the following components: processor 640, memory 650, input/output (I/O) circuitry 620, and peripheral devices 630, each of which may also include a delay circuit of the present invention. These components are coupled together by system bus 665 and are populated on circuit board 660 which is contained in end-user system 670. A data processing system such as system 600 may include a single end-user system such as end-user system 670 or may include a plurality of systems working together as a data processing system.

System 600 can be used in a wide variety of applications, such as computer networking, data networking, instrumentation, video processing, DSP, or any other application where the advantage of using programmable or reprogrammable logic is desirable. PLD 610 can be used to perform a variety of different logic functions. For example, PLD 610 can be configured as a processor or controller that works in cooperation with processor 640 (or, in alternative embodiments, a PLD might itself act as the sole system processor). PLD 610 may also be used as an arbiter for arbitrating access to a shared resource in system 600. In yet another example, PLD 610 can be configured as an interface between processor 640 and one of the other components in system 600. It should be noted that system 600 is only exemplary.

In one embodiment, system 600 is a digital system. As used herein a digital system is not intended to be limited to a purely digital system, but also encompasses hybrid systems that include both digital and analog subsystems.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A delay circuit comprising:
   a first delay cell oriented in a first orientation; and
   a second delay cell oriented in a second orientation,
   wherein the second delay cell is coupled to the first delay cell, the second orientation is different from the first orientation, and the delay circuit is in an input/output circuit.

2. The delay circuit of claim 1, wherein the first orientation is perpendicular to the second orientation.

3. The delay circuit of claim 2, wherein the first orientation is vertical and the second orientation is horizontal.

4. The delay circuit of claim 1 further comprising:
   a first series of delay cells orientated in the first orientation, wherein the first series of delay cells includes the first delay cell; and
   a second series of delay cells orientated in the second orientation, wherein the second series of delay cells includes the second delay cell.

5. The delay circuit of claim 4 further comprising:
   a first multiplexer;
   a second multiplexer; and
   a third multiplexer;
   wherein the first multiplexer is coupled to the first series of delay cells, the second series of delay cells, and the third multiplexer; the second multiplexer is coupled to an input clock signal, the first series of delay cells, and the second series of delay cells; and the third multiplexer is coupled to the first multiplexer and second series of delay cells;
   further wherein the first series of delay cells receives an input clock signal and provides a first output clock signal; the first multiplexer receives the first output clock signal and an output of the second series of delay cells and provides a first multiplexer output signal; the second multiplexer receives the input clock signal and the first output clock signal and provides a second multiplexer output signal; the second series of delay cells receives the second multiplexer output signal and provides the output of the second series of delay cells; and the third multiplexer receives the first multiplexer output signal and the output of the second series of delay cells and provides an output clock signal; and
   further wherein, if in a first orientation bank, the first multiplexer selects the first output clock signal, and, if in a second orientation bank, the first multiplexer selects the output of the second series of delay cells; if in high frequency mode, the second multiplexer selects the input clock signal, and, if in low frequency mode, the second multiplexer selects the first output clock signal; and, if in high frequency mode, the third multiplexer selects the first multiplexer output signal, and, if in low frequency mode, the third multiplexer selects the output of the second series of delay cells.

6. The delay circuit of claim 4 further comprising:
   a multiplexer coupled to the first series of delay cells and the second series of delay cells;
   wherein the first series of delay cells receives an input clock signal and provides a first output clock signal, the second series of delay cells receive the first output clock signal and provides a second output clock signal, the multiplexer receives the first output clock signal and the second output clock signal and provides an output clock signal;
   further wherein, in high frequency mode, the multiplexer selects the first output clock signal as the output clock signal, and, in low frequency mode, the multiplexer selects the second output clock signal as the output clock signal.

7. The delay circuit of claim 1 further comprising:
   a first series of delay cells including a first group of delay cells orientated in the first orientation and a second group of delay cells orientated in the second orientation, wherein the first group includes a first set of alternate delay cells of the first series and the second group includes a second set of alternate delay cells of the first series, further wherein the first group includes the first delay cell; and
   a second series of delay cells including a third group of delay cells orientated in the first orientation and a fourth group of delay cells orientated in the second orientation, wherein the third group includes a first set of alternate delay cells of the second series and the fourth group includes a second set of alternate delay cells of the second series, further wherein the fourth group includes the second delay cell.

8. The delay circuit of claim 7 further comprising:
   a multiplexer coupled to the first series of delay cells and the second series of delay cells;
   wherein the first series of delay cells receives an input clock signal and provides a first output clock signal; the second series of delay cells receive the first output clock signal and provides a second output clock signal; and the multiplexer receives the first output clock signal and the second output clock signal and provides an output clock signal;
   further wherein, in high frequency mode, the multiplexer selects the first output clock signal as the output clock signal, and, in low frequency mode, the multiplexer selects the second output clock signal as the output clock signal.

9. An input/output bank including the delay circuit of claim 1.

10. A programmable logic device including the delay circuit of claim 1.

11. A digital system comprising a programmable logic device including the delay circuit of claim 1.

12. A method of delaying a signal, the method comprising:
    creating a first delayed signal using a first plurality of delay cells, where at least one delay cell of the first plurality of delay cells is in a first orientation, and where the first delayed signal is a delayed version of the signal; and
    creating a second delayed signal using a second plurality of delay cells, where at least one delay cell of the second plurality of delay cells is in a second orientations wherein the second plurality of delay cells is coupled to the first plurality of delay cells the second orientation is different from the first orientation, and the first plurality of delay cells and the second plurality of delay cells are in an input/output circuit.

13. The method of claim 12, wherein the first orientation is perpendicular to the second orientation.

14. The method of claim 12, wherein the first orientation is vertical and the second orientation is horizontal.

15. The method of claim 13 further comprising:
selecting between the first and second delayed signals.

16. A delay circuit comprising:
a first series of delay cells including a first group of delay cells orientated in a first orientation and a second group of delay cells orientated in a second orientation that is perpendicular to the first orientation, wherein the first group includes a first set of alternate delay cells of the first series and the second group includes a second set of alternate delay cells of the first series;
a second series of delay cells including a third group of delay cells orientated in the first orientation and a fourth group of delay cells orientated in the second orientation, wherein the third group includes a first set of alternate delay cells of the second series and the fourth group includes a second set of alternate delay cells of the second series; and
a multiplexer coupled to the first series of delay cells and the second series of delay cells, wherein the multiplexer selects between a first output clock signal received from the first series of delay cells and a second output clock signal received from the second series of delay cells.

17. The delay circuit of claim 16, wherein the first series of delay cells receives an input clock signal and provides the first output clock signal; the second series of delay cells receive the first output clock signal and provides the second output clock signal; and the multiplexer receives the first output clock signal and the second output clock signal and provides an output clock signal;
further wherein, in high frequency mode, the multiplexer selects the first output clock signal as the output clock signal, and, in low frequency mode, the multiplexer selects the second output clock signal as the output clock signal.

18. The delay circuit of claim 17, wherein the first orientation is a vertical orientation and the second orientation is a horizontal orientation.

19. An input/output bank including the delay circuit of claim 16.

20. A programmable logic device including the delay circuit of claim 16.

21. A digital system comprising a programmable logic device including the delay circuit of claim 16.

\* \* \* \* \*